US011051392B2

(12) United States Patent
Chang

(10) Patent No.: US 11,051,392 B2
(45) Date of Patent: Jun. 29, 2021

(54) HEAT DISSIPATING DEVICE

(71) Applicant: TEAM GROUP INC., New Taipei (TW)

(72) Inventor: Chin Feng Chang, New Taipei (TW)

(73) Assignee: Team Group Inc., New Taipei (TW)

( * ) Notice: Subject to any disclaimer, the term of this patent is extended or adjusted under 35 U.S.C. 154(b) by 0 days.

(21) Appl. No.: 16/695,767

(22) Filed: Nov. 26, 2019

(65) Prior Publication Data
US 2021/0100090 A1 Apr. 1, 2021

(51) Int. Cl.
*H05K 1/02* (2006.01)
*H05K 7/20* (2006.01)

(52) U.S. Cl.
CPC ....... *H05K 1/0201* (2013.01); *H05K 7/20509* (2013.01); *H05K 2201/0212* (2013.01); *H05K 2201/0215* (2013.01)

(58) Field of Classification Search
CPC .......... H05K 1/021; H05K 1/092; H05K 1/0203–0204; H05K 2201/0212; H05K 2201/06; H05K 2201/066; H05K 2201/0215; H05K 2201/10416; H05K 2201/0323; H05K 2201/0338; H05K 7/3039; F28F 21/081; F28F 21/084–085; F28F 21/02; F28F 13/00; F28F 2013/006; F28F 3/00; H01L 23/3735–3736; H01L 24/092; H01L 29/1606; H01L 21/02527; H01L 2221/68363; F28D 2021/0028–0029; B32B 7/12; B32B 9/007; B32B 15/04; B32B 15/20

USPC .............. 361/704, 679.54; 257/706; 174/252
See application file for complete search history.

(56) References Cited

U.S. PATENT DOCUMENTS

| | | | |
|---|---|---|---|
| 9,736,923 B1* | 8/2017 | Starkovich | F28F 21/089 |
| 2009/0021918 A1* | 1/2009 | Fang | H01L 23/4006 361/720 |
| 2010/0085713 A1* | 4/2010 | Balandin | H05K 1/0206 361/705 |
| 2013/0020606 A1* | 1/2013 | Han | H05K 1/0203 257/99 |
| 2013/0167897 A1* | 7/2013 | Choi | H01L 35/22 136/239 |
| 2013/0272951 A1* | 10/2013 | Hiura | B82Y 30/00 423/448 |
| 2014/0218867 A1* | 8/2014 | Kim | B32B 9/045 361/704 |
| 2015/0151528 A1* | 6/2015 | Shimizu | B32B 7/12 428/408 |

(Continued)

*Primary Examiner* — Zachary Pape
*Assistant Examiner* — Amir A Jalali
(74) *Attorney, Agent, or Firm* — Rosenberg, Klein & Lee

(57) ABSTRACT

The present invention relates to a heat dissipating device disposed on a circuit board. The heat dissipating device is provided with a first glue layer, a first graphene composite heat dissipating layer, a second glue layer, a second graphene composite heat dissipating layer, and a resin layer in this order from bottom to top. Furthermore, the first graphene composite heat dissipating layer and the second graphene composite heat dissipating layer are doped with a plurality of metal particles, and the first graphene composite heat dissipating layer and the second graphene composite heat dissipating layer are respectively covered by a metal layer. The above structure is simple, space-saving, and has good thermal conductivity.

10 Claims, 4 Drawing Sheets

(56) References Cited

U.S. PATENT DOCUMENTS

| | | | |
|---|---|---|---|
| 2016/0057854 A1* | 2/2016 | Schneider | B32B 27/36 |
| | | | 174/252 |
| 2016/0249445 A1* | 8/2016 | Min | H05K 1/181 |
| 2017/0050417 A1* | 2/2017 | St. Rock | B32B 7/06 |
| 2017/0108383 A1* | 4/2017 | Chow | G01K 7/021 |
| 2017/0182474 A1* | 6/2017 | Zhamu | B01J 20/20 |
| 2017/0194074 A1* | 7/2017 | Sohn | C01B 32/186 |
| 2017/0223828 A1* | 8/2017 | Tanielian | C25D 5/54 |
| 2017/0337999 A1* | 11/2017 | Na | B32B 9/04 |
| 2017/0338312 A1* | 11/2017 | Treossi | H01L 21/683 |
| 2018/0155825 A1* | 6/2018 | Farquhar | C23C 16/545 |
| 2018/0269174 A1* | 9/2018 | Fathi | B23K 26/34 |
| 2019/0008000 A1* | 1/2019 | Li | B32B 27/32 |
| 2019/0283377 A1* | 9/2019 | Lin | C08J 7/0423 |
| 2020/0061970 A1* | 2/2020 | Chen | F41H 1/02 |

* cited by examiner

HEAT DISSIPATING DEVICE

FIELD OF THE INVENTION

The present invention relates generally to a heat dissipating device, and particularly to a heat dissipating device combining graphene and metal particles.

BACKGROUND OF THE INVENTION

A computer includes many electronic devices disposed in the housing, such as the CPU, hard disks, and display cards. When these electronic devices are operating, much heat will be generated. To avoid computer crash caused by temperature rise in the electronic devices due to overheat, how to dispose heat dissipating devices in the electronic devices becomes a crucial subject for a computer.

Furthermore, compared to the other electronic device, the heat dissipating device used on hard disks are especially important. Hard disks store massive data; they are also the place to install the operating system and the driver programs. Once they crash due to overheat, data errors will occur and the computer cannot be started. In addition, if there is no other medium to help dissipating heat, unless the capability of natural air cooling (flowing air carrying away heat) of the environment or forced air cooing (forced blowing of heat away from the housing by fans) is strong enough, a plurality of electronic components on the hard disks will deteriorate or even damage owing to long-term accumulation of thermal energy.

According to the prior art, graphene is generally adopted as the structure for heat conduction and dissipation and the heat dissipating performance is outstanding. Unfortunately, graphene is attached to another material using double-sided adhesive. For attaching two homogeneous or heterogeneous solid materials on a plane, no matter how the pressure is applied or the how flat the plane is polished, they cannot be jointed tightly. The subtle nonflatness and undulation in the double-sided adhesive result in partial contacts at the junction. The voids or holes therein contain air, which is an extremely bad medium for thermal conduction. At room temperature, the thermal conductivity of air is only 0.0242 W/mK. Consequently, this method faces the problem of obstruction of thermal conduction path by air.

Accordingly, how to provide a heat dissipating device for conquering the problem of air existence as described and enhancing heat dissipating performance is the research direction of the present invention.

SUMMARY

An objective of the present invention is to provide a heat dissipating device to solve problem of lowered heat dissipating performance due to air existence between the glue layer and the heat dissipating layer according to the prior art.

To achieve the above objective, the present invention discloses a heat dissipating device disposed on a circuit board and comprising a first glue layer, a first graphene composite heat dissipating layer, a second glue layer, a second graphene composite heat dissipating layer, and a resin layer. The first glue layer is disposed on the circuit board. The first graphene composite heat dissipating layer is jointed to the first glue layer. The second glue layer is jointed to the first graphene composite heat dissipating layer. The second graphene composite heat dissipating layer is jointed to the second glue layer. The resin layer is disposed on the second graphene composite heat dissipating layer. In addition, the first graphene composite heat dissipating layer and the second graphene composite heat dissipating layer include a plurality of first metal particles. A metal layer further covers the first graphene composite heat dissipating layer and the second graphene composite heat dissipating layer, respectively, for avoiding air between the glue layer and the heat dissipating layers and thus enhancing heat dissipating performance.

According to an embodiment of the present invention, the circuit board is a solid-state hard disk or a memory.

According to an embodiment of the present invention, the plurality of first metal particles are copper particles or aluminum particles.

According to an embodiment of the present invention, the material of the metal layer is copper.

According to an embodiment of the present invention, the first glue layer is doped by a plurality of second metal particles. The first glue layer can be a graphene double-sided adhesive, an acrylic double-sided adhesive, a silica gel double-sided adhesive, a grid double-sided adhesive, a reinforced double-sided adhesive, a rubber double-sided adhesive, a high-temperature double-sided adhesive, a non-woven double-sided adhesive, a non-residual-glue double-sided adhesive, a tissue-paper double-sided adhesive, a double-sided glass cloth adhesive, a PET double-sided adhesive, or a foam double-sided adhesive.

According to an embodiment of the present invention, the plurality of second metal particles are copper particles or aluminum particles.

According to an embodiment of the present invention, the second glue layer is doped by a plurality of third metal particles. The second glue layer can be a graphene double-sided adhesive, an acrylic double-sided adhesive, a silica gel double-sided adhesive, a grid double-sided adhesive, a reinforced double-sided adhesive, a rubber double-sided adhesive, a high-temperature double-sided adhesive, a non-woven double-sided adhesive, a non-residual-glue double-sided adhesive, a tissue-paper double-sided adhesive, a double-sided glass cloth adhesive, a PET double-sided adhesive, or a foam double-sided adhesive.

According to an embodiment of the present invention, the plurality of third metal particles are copper particles or aluminum particles.

According to an embodiment of the present invention, the material of the resin layer can be selected from the group consisting of polyimide (PI), polyethylene terephthalate (PET), polyethylene (PE), biaxially oriented polypropylene (BOPP), polycarbonate (PC), polystyrene (PS), polyvinyl chloride (PVC).

According to an embodiment of the present invention, the circuit board is disposed on a motherboard. A heat dissipating member is disposed on the motherboard. When the heat dissipating device is disposed on the circuit board and the circuit board is installed on the motherboard, the heat dissipating member is attached to the heat dissipating device.

DETAILED DESCRIPTION

In order to make the structure and characteristics as well as the effectiveness of the present invention to be further understood and recognized, the detailed description of the present invention is provided as follows along with embodiments and accompanying figures.

The present invention provides a heat dissipating device to solve the problem of reduced heat dissipating performance due to existence of air between the glue layer and the heat dissipating layer according to the prior art.

Figure 1:
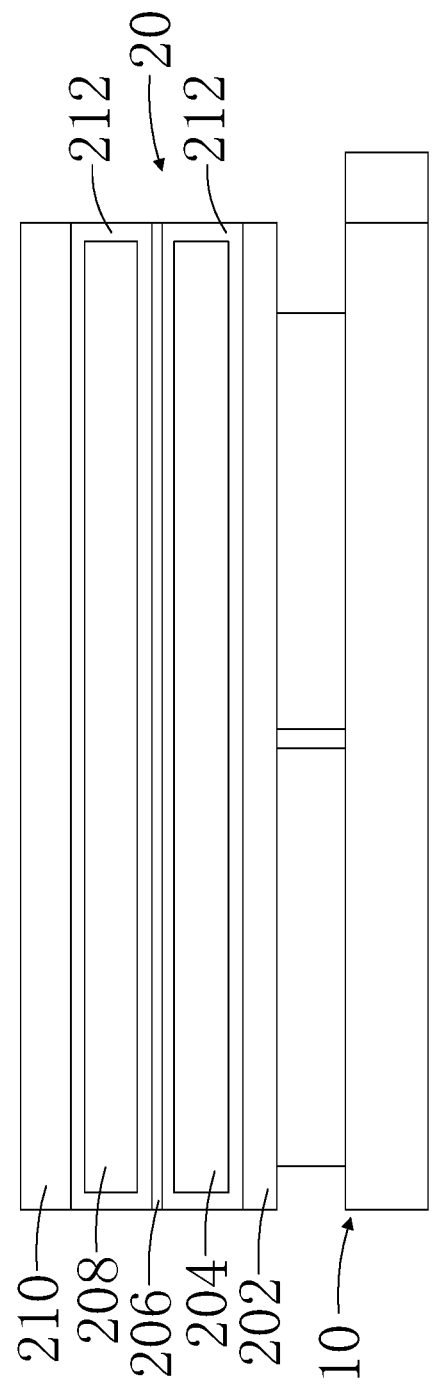
FIG. 1 shows a side view of the heat dissipating device according a first embodiment of the present invention.
Figure 2:
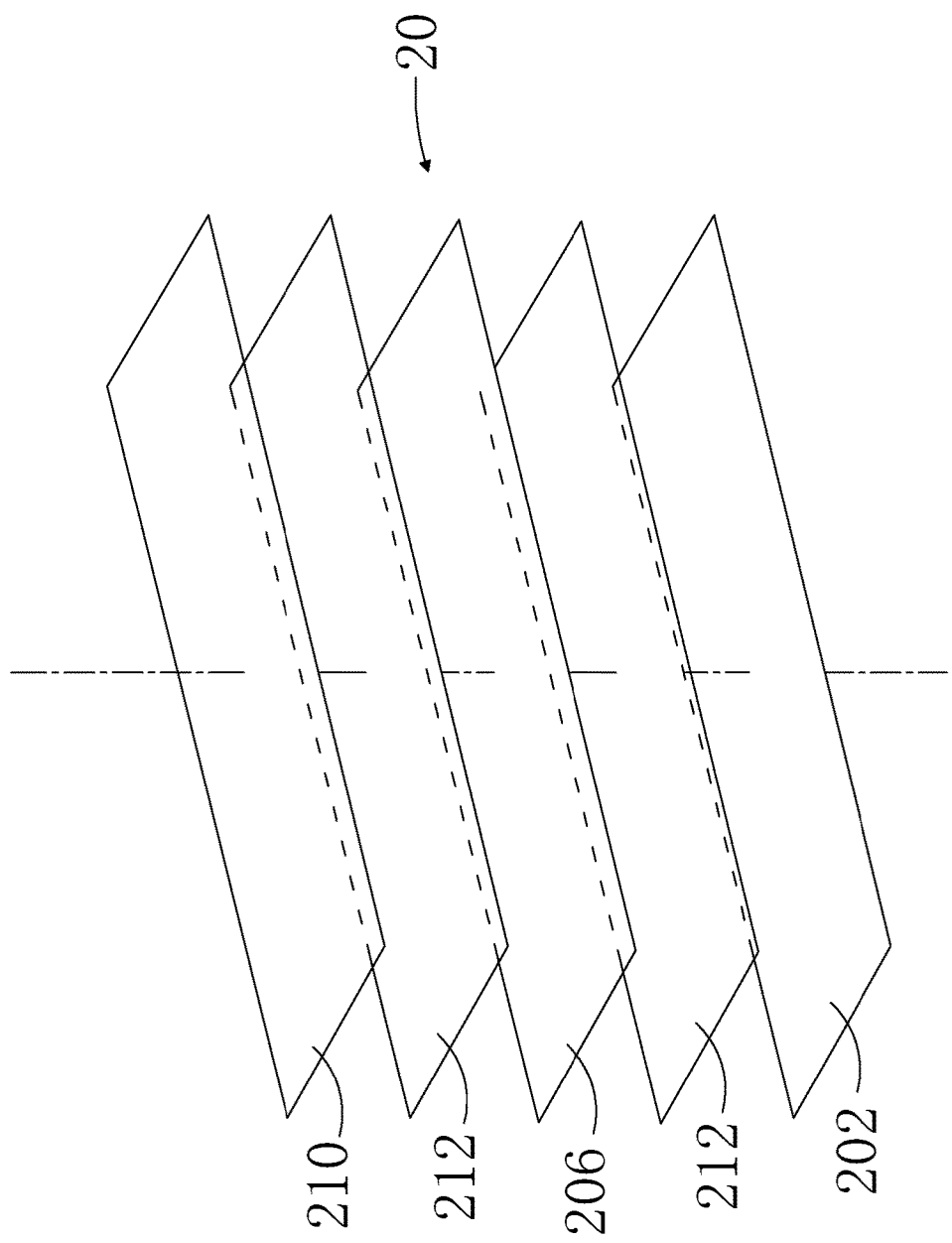
FIG. 2 shows an exploded view of the heat dissipating device according a first embodiment of the present invention.
Figure 3:
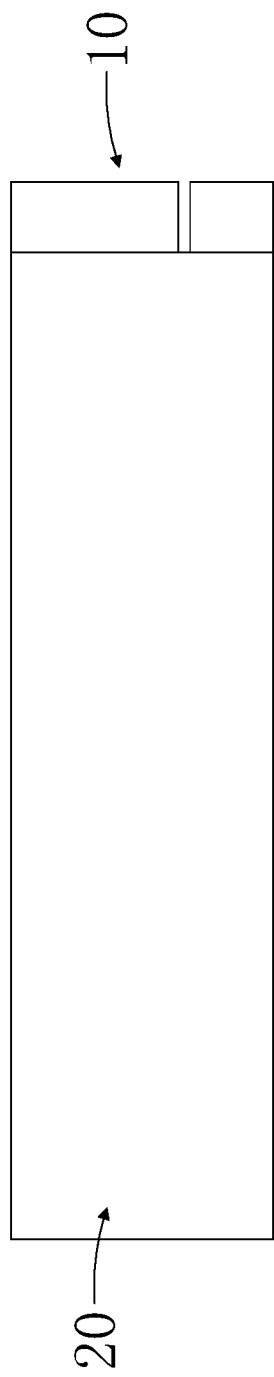
FIG. 3 shows a top view of the heat dissipating device according a first embodiment of the present invention.

Please refer to FIGS. 1 to 3, which show a side view, an exploded view, and a top view of the heat dissipating device according a first embodiment of the present invention. As shown in the figures, according to the present embodiment, the heat dissipating device 20 is disposed on a circuit board 10 and comprises a first glue layer 202, a first graphene composite heat dissipating layer 204, a second glue layer 206, a second graphene composite heat dissipating layer 208, and a resin layer 210. The first glue layer 202 is disposed on the circuit board 10. The first graphene composite heat dissipating layer 204 is jointed to the first glue layer 202. The second glue layer 206 is jointed to the first graphene composite heat dissipating layer 204. The second graphene composite heat dissipating layer 208 is jointed to the second glue layer 206. The resin layer 210 is disposed on the second graphene composite heat dissipating layer 208. In addition, the first graphene composite heat dissipating layer 204 and the second graphene composite heat dissipating layer 208 are doped by a plurality of first metal particles. The adding methods include selectively etching, doping, ion injection, molecular beam epitaxy, or vapor phase deposition; the first metal particles include, for example, copper particles or aluminum particles. According to the present embodiment, the doping method is selected and the first metal particles are copper particles. Nonetheless, the present invention is not limited to the present embodiment. Besides, a metal layer 212 further covers the first graphene composite heat dissipating layer 204 and the second graphene composite heat dissipating layer 208, respectively. The material of the metal layer 212 can be selected from various metals such as copper or aluminum. According to the present embodiment, copper is selected. Nonetheless, the present invention is not limited to the present embodiment.

Please continue to refer to FIGS. 1 to 3. According to the present embodiment, the first graphene composite heat dissipating layer 204 and the second graphene composite heat dissipating layer 208 are selected to be graphene copper. The porous nanometer hole structure of graphene has high porosity and specific surface area as well as superior property of adhering metal particle. Thereby, the graphene thin film and the deposition layer of metal copper particles can be combined to form a single heterostructure composite material. In addition, since the metal layer 212 covers the first graphene composite heat dissipating layer 204 and the second graphene composite heat dissipating layer 208, respectively, while attaching the first glue layer 202 and the second glue layer 206, the subtle nonflatness and undulation can be filled. Then the attachment efficiency can be improved and the voids or hole can be reduced. By preventing the problem of obstruction of thermal conduction path by air, the thermal conduction efficiency can be enhanced.

The first graphene composite heat dissipating layer 204 and the second graphene composite heat dissipating layer 208 are doped by the plurality of first metal particles, improving the thermal conductivity, thermal radiation property, and heat capacity. The thermal conductivity K represents the capability of direct thermal conduction of a material. The heat capacity is the property of a material absorbing (or releasing) heat while being heated or cooled and is represented by specific heat capacity. If the specific heat capacity is larger, the capacity of absorbing or releasing heat of an object is greater. The first metal particles are selected to be copper or aluminum particles. According to the present embodiment, copper particles are selected. Nonetheless, the present invention is not limited to the present embodiment. The thermal conductivity of graphene (less than 3 nanometers) in the X and Y axes are greater than 1500. The thermal conductivity of copper-particle deposition is greater than 300. The thermal radiative emission rate of graphene in the infrared range is 0.99, approaching the theoretical thermal radiative emission rate of black body, 1. Thereby, in heat dissipation applications, graphene owns both properties of superior thermal conduction and radiation. The specific heat capacity of graphene is 720 J/kg*K; the specific heat capacity of copper-particle deposition is 385 J/kg*K. Accordingly, the first graphene composite heat dissipating layer 204 and the second graphene composite heat dissipating layer 208 containing the plurality of first metal particles own improved thermal conductivity, thermal radiation, and heat capacity.

The present invention also uses experiments to verify heat dissipation performance. The related data of the experiments are listed in the following Tables 1 and 2:

TABLE 1

|  | Circuit board 10 | | | Circuit board 10 with heat dissipating device 20 | | |
| --- | --- | --- | --- | --- | --- | --- |
| Test time | 1 Hr | 2 Hr | 3 Hr | 1 Hr | 2 Hr | 3 Hr |
| Temperature (□) | 62.7 | 62.4 | 66.5 | 60.2 | 60.8 | 61 |
| Compared with bare board (□) |  |  |  | −2.5 | −1.6 | −5.5 |
| Compared with bare board (%) |  |  |  | −4 | −3 | −8 |

TABLE 2

|  | Single-layer heat dissipation | | Double-layer heat dissipation | |
| --- | --- | --- | --- | --- |
| Test time | 1 Hr | 2 Hr | 1 Hr | 2 Hr |
| Temperature (□) | 62.9 | 64.2 | 61.6 | 58.1 |

According to Table 1, by adopting the circuit board 10 with the heat dissipating device 20, the temperature reduction effect is significant compared with the one without. Besides, in Table 2, the single-layer heat dissipation refers to using only the first glue layer 202, the first graphene composite heat dissipating layer 204, and the resin layer 210. The double-layer heat dissipation refers to the structure according to the present embodiment. According to Table 2, compared with the single-layer heat dissipation, the double-layer heat dissipation owns better heat dissipation effect with lowered temperatures. The experiments according to the present invention are performed using simulation with the environment of hood deployment and no fans.

Figure 4:
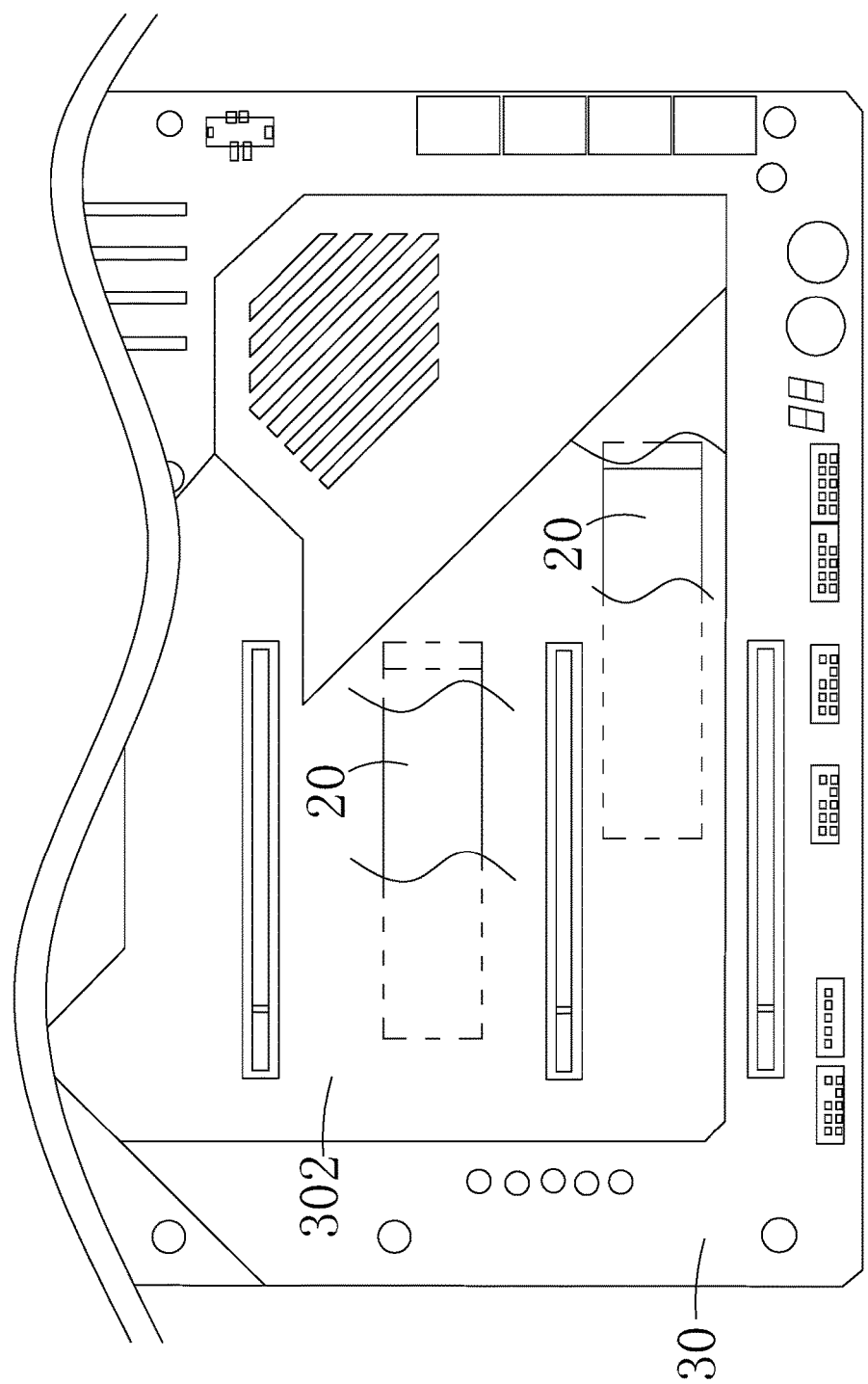
FIG. 4 shows a schematic diagram of installing the heat dissipating device according an embodiment of the present invention.

Please continue to refer to FIGS. 1 to 3 as well as to FIG. 4, which shows a schematic diagram of installing the heat dissipating device according an embodiment of the present invention. As shown in the figures, according to the present embodiment, the circuit board 10 is disposed on a motherboard 30. A heat dissipating member 302 is disposed on the motherboard 30. When the heat dissipating device 20 is disposed on the circuit board 10 and the circuit board 10 is installed on the motherboard 30, the heat dissipating member 302 is attached to the heat dissipating device 20. As the motherboard 30 is operating the massive heat is generated, the first graphene composite heat dissipating layer 204 and the second graphene composite heat dissipating layer 208 can transfer the heat from the motherboard 30 to the heat dissipating device 20 rapidly. Moreover, because the heat dissipating member 302 is attached to the heat dissipating device 20, partial heat from the heat dissipating device 20 can be transferred to the heat dissipating member for reducing the temperature of the circuit board 10 and hence improving the operating performance of the circuit board 10.

The circuit board 10 is a solid-state hard disk or a memory. The first glue layer 202 and the second glue layer 206 can be a graphene double-sided adhesive, an acrylic double-sided adhesive, a silica gel double-sided adhesive, a grid double-sided adhesive, a reinforced double-sided adhesive, a rubber double-sided adhesive, a high-temperature double-sided adhesive, a non-woven double-sided adhesive, a non-residual-glue double-sided adhesive, a tissue-paper double-sided adhesive, a double-sided glass cloth adhesive, a PET double-sided adhesive, or a foam double-sided adhesive. In addition, the first glue layer 202 is doped by a plurality of second metal particles; the second glue layer 206 is doped by a plurality of third metal particles. According to the present embodiment, the plurality of second metal particles and the plurality of third metal particles are selected to be, but not limited to, copper particles or aluminum particles. The method for disposed the first glue layer 202, the first graphene composite heat dissipating layer 204, the second glue layer 206, the second graphene composite heat dissipating layer 208, and the resin layer 210 sequentially at a time is attaching or adhering. The material of the resin layer 210 is selected from the group consisting of polyimide (PI), polyethylene terephthalate (PET), polyethylene (PE), biaxially oriented polypropylene (BOPP), polycarbonate (PC), polystyrene (PS), polyvinyl chloride (PVC).

To sum up, the present invention provides the heat dissipating device 20 by disposing the first glue layer 202, the first graphene composite heat dissipating layer 204, the second glue layer 206, the second graphene composite heat dissipating layer 208, and the resin layer 210 sequentially at a time. The plurality of first metal particles are disposed in the first graphene composite heat dissipating layer 204 and second graphene composite heat dissipating layer 208. Besides, the metal layer 212 covers the first graphene composite heat dissipating layer 204 and second graphene composite heat dissipating layer 208, respectively for reducing the nonflatness and undulation and enhancing the attachment efficiency. Thereby, the thermal conduction performance of the heat dissipating device can be improved. 20

Accordingly, the present invention conforms to the legal requirements owing to its novelty, nonobviousness, and utility. However, the foregoing description is only embodiments of the present invention, not used to limit the scope and range of the present invention. Those equivalent changes or modifications made according to the shape, structure, feature, or spirit described in the claims of the present invention are included in the appended claims of the present invention.

What is claimed is:

1. A heat dissipating device, disposed on a circuit board, and comprising:
    a first glue layer, disposed on the circuit board;
    a first graphene composite heat dissipating layer, disposed on the first glue layer;
    a second glue layer, disposed on the first graphene composite heat dissipating layer;
    a second graphene composite heat dissipating layer, disposed on the second glue layer; and
    a resin layer, disposed on the second graphene composite heat dissipating layer;
    wherein, the first graphene composite heat dissipating layer and the second graphene composite heat dissipating layer are doped by a plurality of first metal particles respectively; and
    each of the first graphene composite heat dissipating layer and the second graphene composite heat dissipating layer is surrounded by a metal layer, the metal layer of the first graphene composite heat dissipation layer is respectively jointed to the first glue layer and the second glue layer while the metal layer is surrounded the first graphene composite heat dissipating layer, and the metal layer of the second graphene composite heat dissipation layer is respectively jointed to the second glue layer and the resin layer while the metal layer is surrounded the second graphene composite heat dissipating layer; and the first glue layer is doped by a plurality of second metal particles, the second glue layer is doped by a plurality of third metal particles.

2. The heat dissipating device of claim 1, wherein the circuit board is a solid-state hard disk or a memory.

3. The heat dissipating device of claim 1, wherein the plurality of first metal particles are copper particles or aluminum particles.

4. The heat dissipating device of claim 1, wherein the material of the metal layer is copper or aluminum.

5. The heat dissipating device of claim 1, wherein the first glue layer is selected from the group consisting of a graphene double-sided adhesive, an acrylic double-sided adhesive, a silica gel double-sided adhesive, a grid double-sided adhesive, a reinforced double-sided adhesive, a rubber double-sided adhesive, a high-temperature double-sided adhesive, a non-woven double-sided adhesive, a non-residual-glue double-sided adhesive, a tissue-paper double-sided adhesive, a double-sided glass cloth adhesive, a PET double-sided adhesive, or a foam double-sided adhesive.

6. The heat dissipating device of claim 1, wherein the plurality of second metal particles are copper particles or aluminum particles.

7. The heat dissipating device of claim 1, wherein the second glue layer is selected from the group consisting of a graphene double-sided adhesive, an acrylic double-sided adhesive, a silica gel double-sided adhesive, a grid double-sided adhesive, a reinforced double-sided adhesive, a rubber double-sided adhesive, a high-temperature double-sided adhesive, a non-woven double-sided adhesive, a non-residual-glue double-sided adhesive, a tissue-paper double-sided adhesive, a double-sided glass cloth adhesive, a PET double-sided adhesive, or a foam double-sided adhesive.

8. The heat dissipating device of claim 1, wherein the plurality of third metal particles are copper particles or aluminum particles.

9. The heat dissipating device of claim 1, wherein the material of the resin layer is selected from the group consisting of polyimide (PI), polyethylene terephthalate (PET), polyethylene (PE), biaxially oriented polypropylene (BOPP), polycarbonate (PC), polystyrene (PS), polyvinyl chloride (PVC).

10. The heat dissipating device of claim 1, wherein the circuit board is disposed on a motherboard; a heat dissipating member is disposed on the motherboard; when the heat dissipating device is disposed on the circuit board and the circuit board is installed on the motherboard, the heat dissipating member is attached to the heat dissipating device.

* * * * *